United States Patent
Lehr

(10) Patent No.: US 9,054,112 B2
(45) Date of Patent: Jun. 9, 2015

(54) SEMICONDUCTOR DEVICE COMPRISING A DIE SEAL HAVING AN INTEGRATED ALIGNMENT MARK

(75) Inventor: Matthias Lehr, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 272 days.

(21) Appl. No.: 13/406,901

(22) Filed: Feb. 28, 2012

(65) Prior Publication Data

US 2012/0223445 A1   Sep. 6, 2012

(30) Foreign Application Priority Data

Mar. 1, 2011   (DE) .................. 10 2011 004 921

(51) Int. Cl.
*H01L 23/544* (2006.01)
*H01L 23/58* (2006.01)

(52) U.S. Cl.
CPC ..... *H01L 23/544* (2013.01); *H01L 2224/81121* (2013.01); *H01L 23/585* (2013.01); *H01L 2223/5442* (2013.01); *H01L 2223/54426* (2013.01); *H01L 2223/54453* (2013.01); *H01L 2924/0002* (2013.01)

(58) Field of Classification Search
CPC .................. H01L 23/544; H01L 2224/81121
USPC ........................... 257/797, 717, 777
See application file for complete search history.

(56) References Cited

U.S. PATENT DOCUMENTS

| 6,624,524 B1 * | 9/2003 | Madurawe .................... 257/797 |
| 7,378,720 B2 | 5/2008 | Fu et al. |
| 2007/0102787 A1 | 5/2007 | Goebel et al. |
| 2007/0187845 A1 * | 8/2007 | Fu et al. ........................ 257/797 |
| 2011/0115057 A1 * | 5/2011 | Harn et al. .................... 257/620 |

OTHER PUBLICATIONS

Translation of Official Communication from German Patent Application No. 10 2011 004 921.5 dated Nov. 8, 2011.

* cited by examiner

*Primary Examiner* — Howard Weiss
*Assistant Examiner* — Tifney Skyles
(74) *Attorney, Agent, or Firm* — Amerson Law Firm, PLLC

(57) ABSTRACT

In semiconductor devices, the alignment mark for performing alignment processes of measurement tools and the like may be positioned within the die seal area on the basis of a geometric configuration, which still preserves mechanical integrity of the die seal without compromising the spatial information encoded into the alignment marks. For example, L-shaped alignment marks may be provided at one or more corners of the die seal area.

17 Claims, 7 Drawing Sheets

SEMICONDUCTOR DEVICE COMPRISING A DIE SEAL HAVING AN INTEGRATED ALIGNMENT MARK

BACKGROUND OF THE INVENTION

1. Field of the Invention

Generally, the present disclosure relates to the field of integrated circuits, and, more particularly, to alignment marks and die seal structures formed in the metallization system of semiconductor devices.

2. Description of the Related Art

Today's global market forces manufacturers of mass products to offer high quality products at a low price. It is thus important to improve yield and process efficiency and, thus, minimize production costs. This holds especially true in the field of semiconductor fabrication, since here it is essential to combine cutting edge technology with mass production techniques. It is, therefore, the goal of semiconductor manufacturers to reduce the consumption of raw materials and consumables while at the same time improve process tool utilization, since, in modern semiconductor facilities, equipment is required which is extremely cost intensive and represents the dominant part of the total production costs. Consequently, high tool utilization, in combination with a high product yield, i.e., with a high ratio of good devices to faulty devices, results in increased profitability.

Integrated circuits are typically manufactured in automated or semi-automated facilities, where the products pass through a large number of process and metrology steps prior to completing the devices. The number and the type of process steps and metrology steps a semiconductor device has to go through depends on the specifics of the semiconductor device to be fabricated. A usual process flow for an integrated circuit may include a plurality of photolithography steps to image a circuit pattern for a specific device layer into a resist layer, which is subsequently patterned to form a resist mask used in further processes for forming device features in the device layer under consideration by, for example, etch, implantation, deposition, polish and anneal processes and the like. Thus, layer after layer, a plurality of process steps are performed based on a specific lithographic mask set for the various layers of the specified device. For instance, a sophisticated CPU requires several hundred process steps, each of which has to be carried out within specified process margins so as to fulfill the specifications for the device under consideration.

For these reasons, a plurality of measurement data is typically obtained for controlling the production processes, such as lithography processes and the like, which may be accomplished by providing dedicated test structures, which are typically positioned within the actual die region or in an area outside of the actual die region. A corresponding outside the die region is also referred to as a frame region, which may be used for dicing the substrate when separating the individual die regions. During the complex manufacturing sequence for completing semiconductor devices, such as CPUs and the like, an immense amount of measurement data is created, for instance, by inspection tools and the like, due to the large number of complex manufacturing processes whose mutual dependencies may be difficult to assess so that usually factory targets are established for certain processes or sequences, wherein it is assumed that these target values may provide process windows so as to obtain a desired final electrical behavior of the completed devices. That is, the complex individual processes or related sequences may be monitored and controlled on the basis of respective inline measurement data such that the corresponding process results are held within the specified process margins, which in turn are determined on the basis of the final electrical performance of the product under consideration. Consequently, in view of enhanced overall process control and appropriately targeting the various processes on the basis of the final electrical performance, optical inspection data obtained from within the die regions and also electrical measurement data is created on the basis of the dedicated test structures provided in the frame region.

In sophisticated semiconductor devices, not only the circuit elements formed in and above a corresponding semiconductor layer require thorough monitoring, but also the metallization system of the semiconductor device is of high complexity, thereby also requiring sophisticated process and material monitoring techniques. Due to the ongoing shrinkage of critical dimensions of the semiconductor-based circuit features, such as transistors and the like, the device features in the metallization system also have to be continuously enhanced with respect to critical dimensions and electrical performance. For example, due to the increased packing density in the device level, the electrical connections of the circuit elements, such as the transistors and the like, require a plurality of stacked metallization layers, which may include metal lines and corresponding vias, in order to provide the complex wiring system of the semiconductor device under consideration. Providing a moderately high number of stacked metallization layers is associated with a plurality of process-related challenges, thereby requiring efficient monitoring and control strategies. For instance, in sophisticated applications, electrical performance in the metallization systems is typically increased by using dielectric materials having a low dielectric constant in combination with metals of high conductivity, such as copper, copper alloys and the like. Since the manufacturing process for forming metallization systems on the basis of dielectric materials of reduced permittivity, also referred to as low-k dielectrics, and highly conductive metals, such as copper, may include a plurality of very complex manufacturing steps, a continual verification of the process results is typically required in order to monitor the overall electrical performance of the metallization system and also performance of associated manufacturing strategies.

Measurement processes to be performed on semiconductor devices during the various phases of the production process are typically performed on the basis of automated measurement systems, in which appropriate alignment mechanisms are implemented in order to appropriately adjust the measurement site with respect to the actual die region or frame region. For example, many optical inspection techniques, such as elipsometry, scatterometry and the like, may critically depend on automated alignment procedures so as to identify appropriate areas within a die region or to identify respective test structures. To this end, typically, appropriate alignment marks are positioned at or in the vicinity of the corners of the die region, which have a characteristic shape, such as a cross-shaped configuration, which may be efficiently identified by the alignment mechanism of the inspection tool or measurement tool under consideration. In this manner, the actual inspection field or measurement field provided by the measurement tool under consideration may be appropriately positioned with respect to the alignment mark, wherein usually a certain lateral distance between the alignment mark and the actual measurement field accessible by the measurement tool is to be taken into consideration. Consequently, in many cases, the actual measurement site may be desirably selected as large as possible in order to have the ability to inspect or measure the entire die region, or at least a very large fraction thereof.

As discussed above, typically, the semiconductor die regions are provided in an array form on an appropriate substrate, wherein the frame regions may provide appropriate lateral offsets of the individual die regions in order to enable appropriate dicing of the substrate upon separating the individual die regions. The width of these scribe lines, on the other hand, may be desirably reduced in order to not unduly waste valuable chip area. On the other hand, the process of dicing the substrate may have a significant influence on the die regions due to the mechanical interaction of a diamond saw blade on dicing the substrate. For this reason, typically, a die seal is provided at the periphery of the actual die regions in order to provide a mechanical "barrier" that should avoid or at least significantly reduce the effects of the mechanical influence during the dicing process. In particular, in combination with highly sophisticated metallization systems, the mechanical barrier effect of the die seal is of great importance, since, typically, low-k dielectric materials and ULK (ultra low-k) materials, which are increasingly used in complex metallization systems, may have a reduced mechanical strength compared to conventional dielectric materials, such as silicon nitride, silicon dioxide and the like. The die seal may thus be provided in the form of appropriate metal features, which may form an appropriate network so as to be firmly connected and embedded in the dielectric material and which may appropriately extend through the metallization layers down into the semiconductor material so as to provide sufficient mechanical strength at the periphery of the die regions. In order to provide the required mechanical characteristics, typically, a certain "metal density" has to be provided within the die seal region and also a certain width of this region may be necessary when appropriate mechanical integrity of the die region is to be ensured.

It turns out, however, that the provision of a mechanically stable die seal and alignment marks, which may allow superior accessibility of the actual die region, may not be compatible with conventional designs and strategies, as will be described in more detail with reference to FIGS. 1a-1c.

FIG. 1a schematically illustrates a top view of a portion of a semiconductor substrate having formed thereon a plurality of semiconductor die regions 100, such as die regions 100A, 100B, 100C. As indicated, these die regions are provided in an array form with an appropriate lateral spacing in between, which may be indicated as frame regions or as scribe lines 151y, 151x. It should be appreciated that, for convenience, the lateral dimensions of the die regions 100 and of the frame regions 151y, 151x are not true to scale. Furthermore, each of the die regions may comprise a die seal region 120, which is to be understood as the area at the periphery of each die region 100, in which a certain density of metal features is to be provided in each metallization layer of a metallization system formed above the substrate. Thus, the die seal regions 120 surround actual inner die regions or "active" regions 110 in which the actual circuit elements and possibly any test structures are to be provided. It should be appreciated, however, that also any test structures (not shown) may be provided within the frame region 151y, 151x if the test results obtained thereof are considered appropriate for estimating characteristics of actual inner die regions 110 and respective manufacturing processes. Furthermore, as shown, one or more alignment marks 130 are typically provided, for instance as a cross, and having appropriate lateral dimensions so as to be readily recognizable by automated alignment mechanisms of inspection tools, or generally measurement and process tools and the like.

FIG. 1b schematically illustrates a more detailed view of a portion of a die region 100. As shown, the die seal region 120 may comprise a plurality of appropriate metal features 122, such as metal line portions, vias and the like, as considered appropriate for achieving the desired high metal density and enable mechanically stable connection to any lower-lying and over-lying further metallization layers. As shown, the die seal region 120 may comprise an outer boundary 1200 and an inner boundary 1201, which define the effective width 120W of the die seal region 120. It should be appreciated that, typically, the boundaries 1200, 1201 may be defined on the basis of layout criteria, such as the presence of non-functional metal features and the like. Typically, the width 120W may be substantially equal at any position around the entire die seal region 120. Moreover, the alignment mark 130 is positioned closely to the die seal region 120, i.e., a corner area thereof. Consequently, upon performing an automated alignment process, typically, a certain lateral offset 110D of the actual inspection field or measurement field 110A provided by the measurement tool under consideration is required with respect to the position of the alignment mark 130. In this case, the peripheral area of the actual inner die region 110 is thus outside of the actual measurement field 110A and is thus not accessible for the measurement or inspection process of interest. For this reason, it has been proposed the alignment mark be outside of the inner die region 110 which, however, may unduly affect the configuration of the scribe lines, i.e., typically an increased width would be required and/or a reconfiguration of corresponding test structures and the like may be necessary.

FIG. 1c schematically illustrates a top view of the portion of the die region 100 according to further alternative suggestions in which the alignment mark 130 is "integrated" into the die seal region 120. Consequently, the actual inspection field 110A may be positioned more closely to the die seal region 120, thereby enabling the measurement of an enlarged area within the die region 110, wherein, however, a significantly reduced width 120R of the die seal region 120 and thus a significantly reduced mechanical strength is obtained. Consequently, upon dicing the substrate, significant mechanical damage may be caused unless the corresponding scribe lines are increased in width, thereby significantly reducing the overall process throughput.

In view of the situation described above, the present disclosure relates to semiconductor devices in which alignment marks may be positioned in a space-efficient manner, while avoiding, or at least reducing, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices in which a required mechanical stability of a die seal may be preserved, while at the same time an appropriate alignment mark may be positioned so as to enable superior monitoring of the inner die region without compromising alignment accuracy and requiring increased scribe lane widths. To this end, the alignment mark may be provided with an appropriate shape with respect to a top view thereof so as to be positioned at least partially within and, in some illustrative embodiments disclosed herein, within the die seal region, however, without unduly affecting the mechanical stability thereof. For this purpose, the alignment mark may be positioned at or close to a corner portion of the die seal region in which generally an increased width is available, wherein the alignment mark may be provided with an appropriately shaped elongated marked portion having a significantly reduced width compared to the remaining die seal region. Furthermore, the geometric characteristics of the alignment mark may be selected such that an appropriate alignment process may be performed, wherein, if desired, different geometric configurations may be selected for the various alignment portions and/or for the various alignment marks in order to provide additional information that may be used during the alignment process.

One illustrative semiconductor device disclosed herein comprises a semiconductor layer formed above a substrate and comprising a plurality of circuit elements. A metallization system is formed above the semiconductor layer and comprises a plurality of metallization layers. Furthermore, the semiconductor device comprises a die seal area defined in at least one of the plurality of metallization layers and delimiting a die region, wherein the die seal area comprises an inner boundary adjacent to the die region and an outer boundary adjacent to a frame region, wherein the inner and outer boundaries determine a width of the die seal area. Furthermore, the semiconductor device comprises a die seal formed within the die seal area in at least one of the plurality of metallization layers. Additionally, the semiconductor device comprises an alignment mark formed within the die seal area laterally adjacent to a portion of the die seal, wherein the alignment mark comprises a first elongated mark portion and a second elongated mark portion whose width is less than a width of the portion of the die seal.

A further illustrative semiconductor device disclosed herein comprises a semiconductor layer formed above a substrate and comprising a plurality of circuit elements. Furthermore, the semiconductor device comprises a metallization system formed above the semiconductor layer and comprising a plurality of metallization layers. Additionally, a dicing area is defined in at least one of the plurality of metallization layers and delimits a die region, wherein the die seal area comprises an inner boundary adjacent to the die region and an outer boundary adjacent to a frame region. Moreover, the inner and outer boundaries determine a width of the die seal area. Additionally, the semiconductor device comprises a die seal formed within the die seal area in at least one of the plurality of metallization layers. Moreover, an alignment mark is formed at least partially within the die seal area laterally adjacent to the outer boundary, wherein the alignment mark comprises a first elongated mark portion and a second elongated mark portion.

A still further illustrative semiconductor device disclosed herein comprises an alignment mark formed in a die seal area and comprising a first elongated mark portion connected to a second elongated mark portion. Furthermore, each of the first and second elongated mark portions is aligned to and is formed laterally adjacent to an outer boundary of the die seal area.

BRIEF DESCRIPTION OF THE DRAWINGS

The disclosure may be understood by reference to the following description taken in conjunction with the accompanying drawings, in which like reference numerals identify like elements, and in which.

Figure 1A:
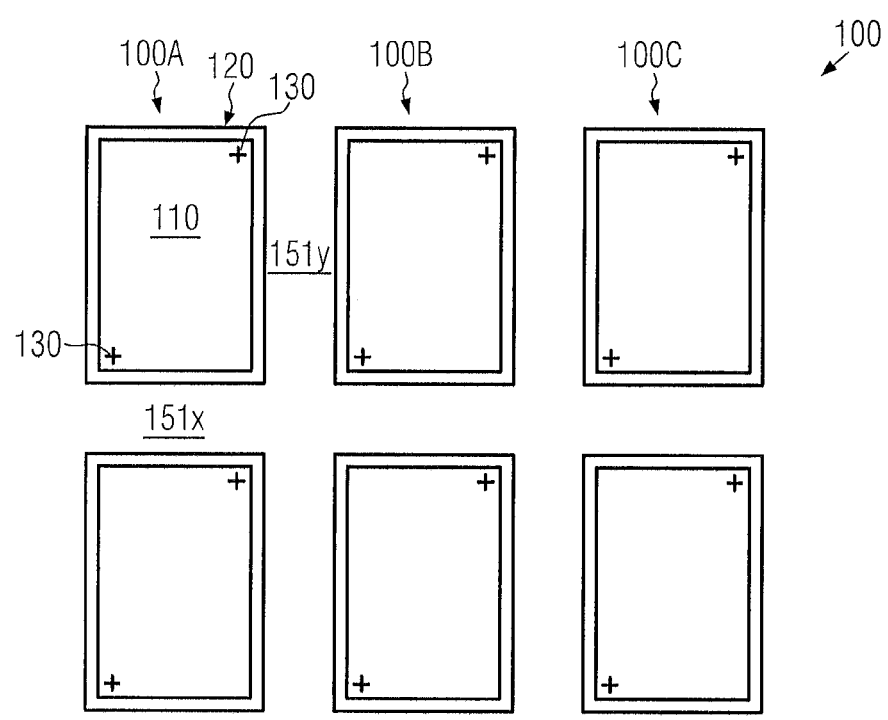
FIGS. 1a-1c schematically illustrate top views of a portion of a semiconductor substrate comprising die regions including an alignment mark and a die seal provided on the basis of conventional geometric concepts.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices in which an alignment mark or two or more alignment marks may be efficiently positioned within, or at least partially within, a die seal region so as to enable an increased measurement or inspection field or generally a process field for any measurement tools or process tools, however, without unduly compromising the mechanical stability of the die seal. To this end, an appropriately shaped alignment mark, for instance comprising elongated mark portions, may be formed, in some illustrative embodiments, advantageously near the outer boundary of the die seal area with a width that is significantly less compared to the width of the remaining die seal in the respective die seal area portion. Consequently, the geometric configuration of any scribe lines may not have to be changed and may be selected so as to obtain a desired compromise between integrity of the die regions and low area consumption in the semiconductor substrate, since a die seal may nevertheless provide the required mechanical stability during the dicing process. By providing appropriate elongated mark portions, which are arranged such that undue lateral increase of the width, and thus a non-desired undue reduction of the width of the corresponding die seal, may be avoided. To this end, the elongated mark portions are appropriately configured and positioned, in some illustrative embodiments, so as to be substantially aligned with the outer boundary of the die seal area at a corner portion thereof, in which locally an increased mechanical stability is provided due to the generally increased width at the corner. Consequently, for a given width of the die seal area in non-corner regions, substantially the same mechanical stability may be preserved in the corner portions thereof, while at the same time appropriately integrating the alignment mark. In some illustrative embodiments, the elongated mark portions may be provided with different geometric characteristics, such as width and/or length, in order to "encode" additional spatial information, for instance with respect to a corresponding side of a die region and the like, thereby providing a highly efficient alignment procedure. Furthermore, the alignment mark may be provided within the die seal area on the basis of any appropriate metal features, which may be well detectable by an automated alignment mechanism and which may be efficiently incorporated into the die seal area. For example, if the die seal may comprise a plurality of "seal rings," the elongated mark portions may efficiently replace a respective portion of one or more of these die seal rings.

Figure 1B:
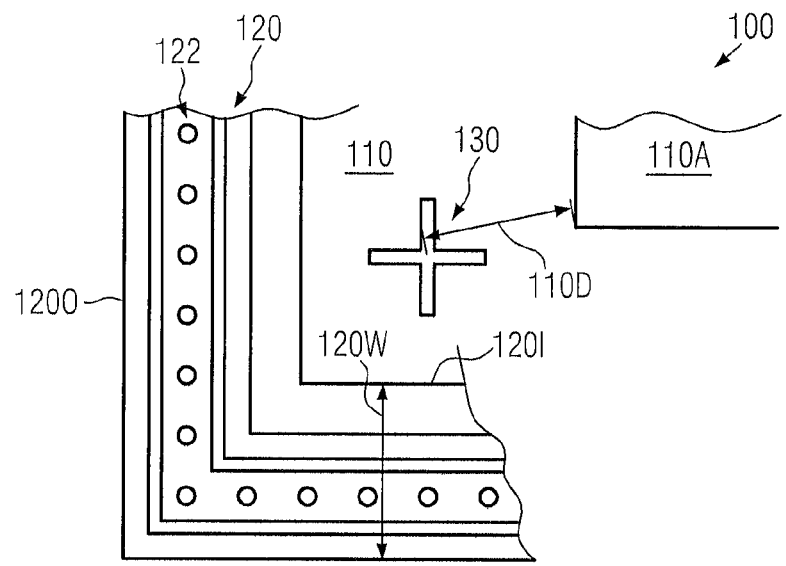
Figure 1C:
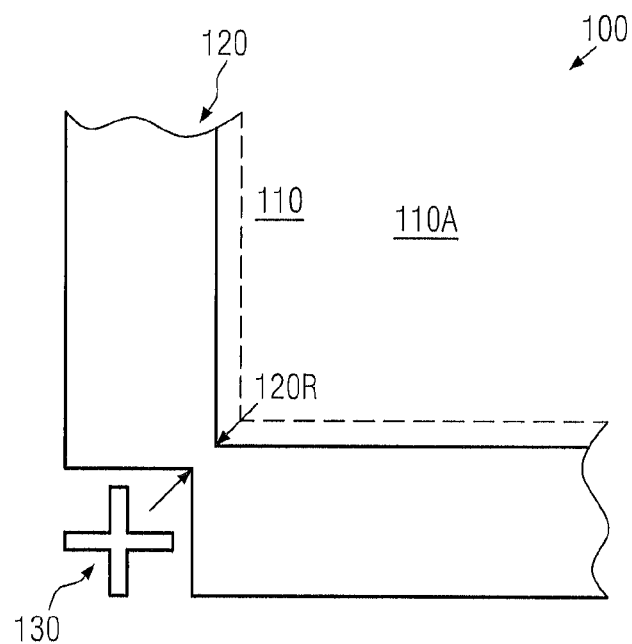

With reference to FIGS. 2a-2g, further illustrative embodiments will now be described in more detail, wherein reference may also be made to FIGS. 1a-1c, if required.

Figure 2A:
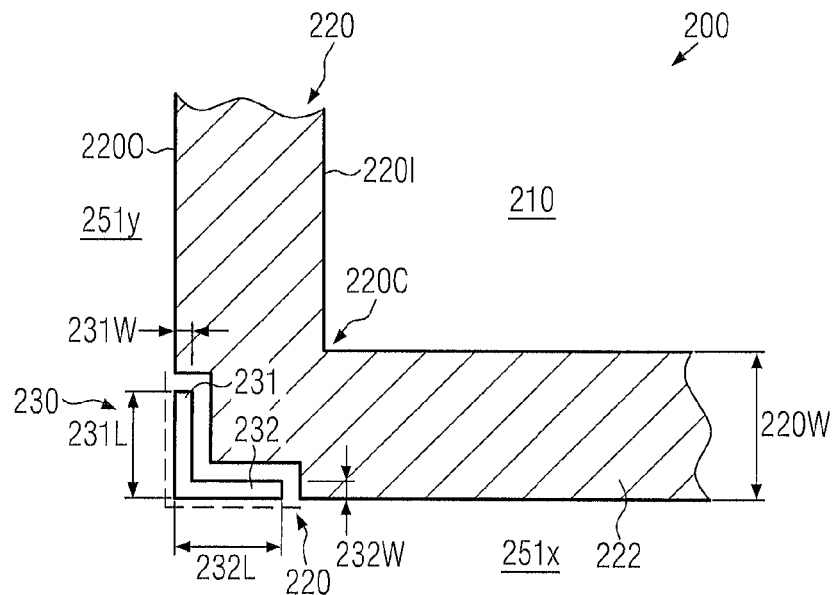
FIGS. 2a-2d schematically illustrate top views of a portion of a semiconductor die region including a die seal area with a die seal and an integrated alignment mark, according to illustrative embodiments.

FIG. 2a schematically illustrates a top view of a semiconductor device 200, which may be understood as a die region representing a part of an array of die regions within an appropriate semiconductor substrate, as is also previously discussed with reference to the substrate and the die regions 100 in FIG. 1a. Thus, the die region 200 may comprise an actual inner die region 210, which may be surrounded by a die seal area 220, which in turn may separate the die region 200 from a corresponding frame region, for instance indicated as scribe lines 251y, 251x, as is also previously explained with reference to FIG. 1a. The die seal area 220 may comprise an inner boundary 220I representing a boundary with respect to the inner die region 210 and which may be defined, for instance, by metal features and the like, which may also comprise a certain zone in which actual circuit elements are not provided. Similarly, an outer boundary 220O may be provided so as to separate the die seal area 220 from the corresponding scribe lines 251y, 251x. Thus, outside of a corner portion 220C of the die seal area 220, a width thereof, indicated by 220W, may be determined by the lateral distance between the inner boundary 220I and the outer boundary 220O. As previously discussed, typically, the width 220W for non-corner portions may be selected to be substantially the same irrespective of the position within the die region 200. It should be appreciated, however, that basically the principles disclosed herein may also be applied to device configurations in which linear portions of the die seal area 220 may basically have a different width, for instance along the scribe lines 251x and the scribe line 251y. Moreover, an alignment mark 230 may be provided at least partially within the die seal area 220, i.e., at least a portion of the alignment mark 230 may be positioned so as to be within the width 220W as defined by the boundaries 220I, 220O. In the embodiment shown in FIG. 2a, the alignment mark 230 may be formed within the area 220. It should be appreciated that the area 220 is to be understood as the area geometrically defined by the inner and outer boundaries 220I, 220O, i.e., their respective extensions, as indicated by the dashed lines. Hence, the area delineated by the dashed lines is also to be considered as a part of the die seal area 220, wherein, however, an actual die seal 222, i.e., an appropriate arrangement of appropriate metal features, may be excluded from the area at which the alignment mark 230 is provided within the inner and outer boundaries 220I, 220O. The alignment mark 230 may comprise a first elongated portion 231 and a second elongated portion 232 which, in the embodiment, are connected to each other so as to form an "L-shaped" configuration in the top view of FIG. 2a. Furthermore, in this illustrative embodiment, the portions 231, 232 directly connect to each other, while in other cases the corresponding device features forming the portions 231, 232, such as metal features or, if considered appropriate, dielectric features, may be separated from each other. Furthermore, the elongated portions 231, 232 may, in some cases, have identical geometric parameters, such as a length 231L, 232L and a width 231W, 232W, while in other cases these elongated portions may differ from each other in at least one of these parameters.

Generally an elongated portion is to be understood in this application as any distinct device feature, such as a metal region, which has one lateral dimension along a first lateral direction that is greater than a second dimension along a second perpendicular lateral direction at any position along the first lateral direction. Usually, the former lateral dimension is referred to as length, while the smaller lateral dimension is referred to as width. It should be appreciated, however, that the general elongated configuration of the portions 231, 232 may also include a configuration in which locally "extension regions" may be provided, thereby locally increasing the width, however, without generally changing the overall elongated configuration of the respective portions 231, 232.

Consequently, the geometric configuration of the alignment mark 230 enables an efficient recognition by an automated alignment system due to the distinct portions 231, 232, which may have an appropriate lateral offset with respect to the actual die seal 222, however, without unduly exceeding the outer boundary 220O, as shown in FIG. 2a, to be within the die seal area. In this respect, "within" is to be understood that the alignment mark 230, i.e., the corresponding portions 231, 232 may extend to the outer boundary 220O and may thus represent the outer boundary in this area of the die seal area 220.

Figure 2B:
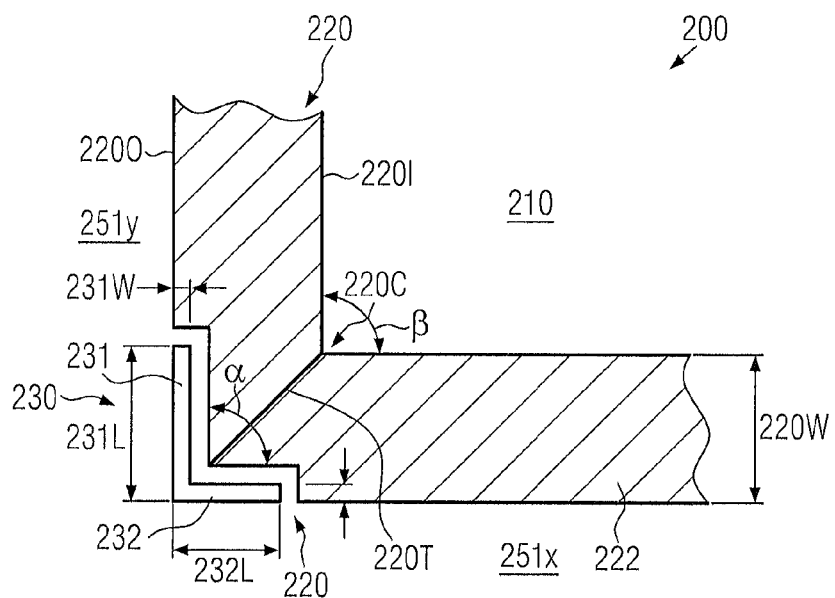

FIG. 2b schematically illustrates the device 200 according to further illustrative embodiments in which the alignment mark 230 may provide a "non-symmetric" configuration by using at least one different geometric parameter for the portions 231, 232. For example, in the embodiment shown, the length 231L may differ from the length 232L, thereby encoding additional spatial information into the alignment mark 230. For example, in this manner, the alignment mark 230 may indicate a specific side of the die region 200. Furthermore, as indicated, an angle α defined by the elongated portions 231, 232 may substantially comply with a corresponding angle β defined by the die seal area 220 at its corner area 220C. In this manner, the elongated portions 231, 232 are substantially aligned to the outer boundary 220O, thereby avoiding undue "penetration" of the adjacent drain region by any of the elongated portions 231, 232. On the other hand, by appropriately aligning the portions 231, 232 to the outer boundary 220O, undue "consumption" of area within the die seal area 220 may be avoided. It should be noted that the angle α is to be understood as an angle defined by the portions 231, 232 or their extensions in a top view as shown in FIG. 2b, wherein the angle is less than 180°.

Furthermore, in some illustrative embodiments, the width 231W, 232W of portions 231, 232 may be selected to be less than approximately 30 percent of the width 220W of the actual die seal 222. In this manner, the overall mechanical stability may not be significantly compromised, since, in the corner portion 220C, the effective width, indicated by 220T, may be increased by, for instance, a factor of 1.44 by approximately 44 percent (square root of 2), thereby providing an increased mechanical strength in the vicinity of the corner portion 220C. Consequently, by restricting the width of the portions 231, 232 to approximately 30 percent, the overall stability at the width 220T and in the vicinity thereof may thus substantially correspond to the mechanical stability as is obtained in the remaining non-corner portions of the die seal area 220.

Figure 2C:
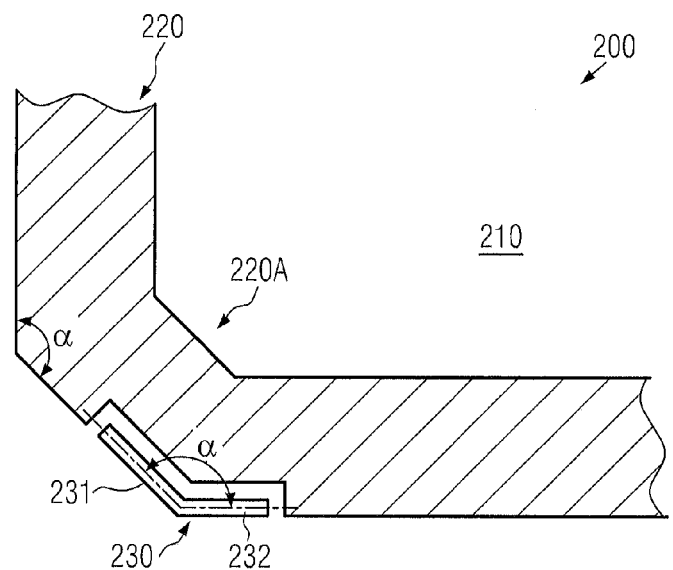

FIG. 2c schematically illustrates a top view of the device 200 according to further illustrative embodiments in which the die seal 220 may comprise a modified "corner portion," as indicated by 220A, in which one or more elongated area portions are connected under an angle α greater than 90° in order to avoid a single 90° angle. In this manner, the alignment mark 230 may be provided at least in one of the corresponding corners of the portion 220A, for instance, such that the portions 231, 232 also define the angle α that is greater than 90°. In this case, the positioning of one alignment mark 230 in one of the corners of the portion 220A may provide additional spatial information since the alignment mark 230 may be placed in a "non-centered" arrangement. With respect to the geometric parameters of the portions 231, 232, the same criteria may apply as previously discussed.

Figure 2D:
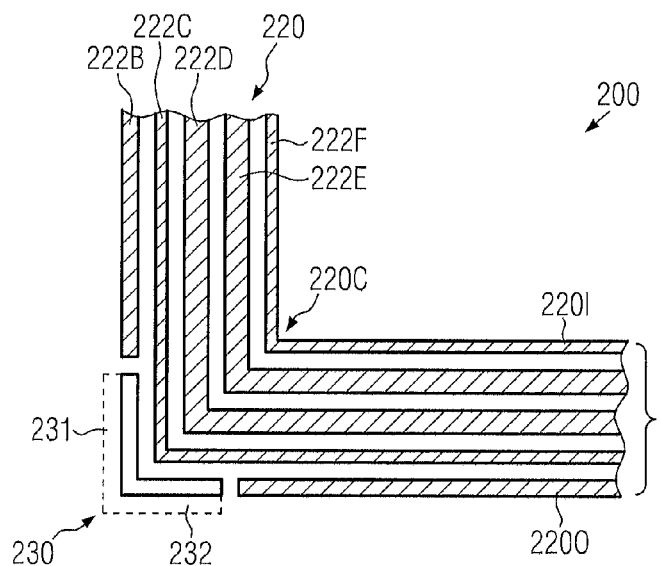

FIG. 2d schematically illustrates the device 200 according to further illustrative embodiments in which a plurality of die seal "rings" 222B-222F may be provided so as to form the actual die seal within the area 220. The individual annularly arranged regions 222B-222F may be provided so as to ensure the required mechanical stability, wherein one or more of these annular portions may be "disrupted" by the alignment mark 230. In the example shown in FIG. 2d, the outermost "ring" 222B may be disrupted in the corner area 220C in order to provide the alignment mark 230, wherein, if desired, a width of one or both of the portions 231, 232 may be selected so as to extend beyond the outer boundary 220O. In other cases, the portions 231, 232 may be provided within the area 220, as previously discussed. Furthermore, if required for appropriate optical characteristics of the alignment mark 230, two or more of the "rings" 222B-222F may be appropriately disrupted while, however, still preserving a sufficient mechanical stability of the remaining non-disrupted die seal rings.

Figure 2E:
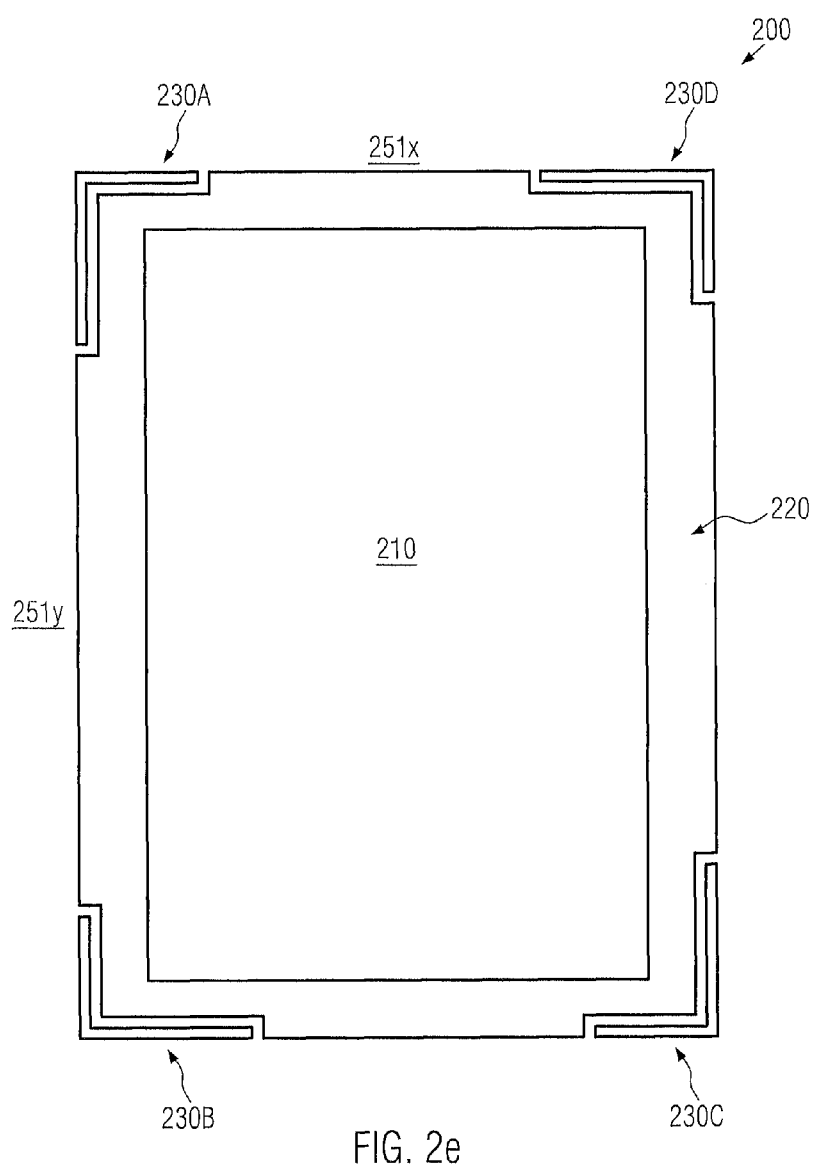
FIG. 2e schematically illustrates a top view of a semiconductor die region comprising a die seal and two or more alignment marks, which may have a different configuration so as to enable superior alignment accuracy, according to illustrative embodiments.

FIG. 2e schematically illustrates the semiconductor device 200 in a top view according to further illustrative embodiments wherein two or more alignment marks 230A-230D may be provided within the die seal area 220. To this end, any appropriate number, such as two or four alignment marks, may be provided. In some illustrative embodiments, as shown in FIG. 2e, at least two of the alignment marks 230A-230D may differ in their geometric configuration in order to provide additional spatial information, thereby enabling a correlation between the position of the respective alignment mark and the corresponding inner die region area 210. For example, the combination of the length of the elongated portions may be uniquely defined so as to enable a correlation to a respective corner of the inner die region 210. In this manner, any position within the die region 210 may be reliably determined on the basis of two alignment marks. If considered appropriate, additional alignment marks may be applied so as to further enhance the overall alignment accuracy and reliability.

Figure 2F:
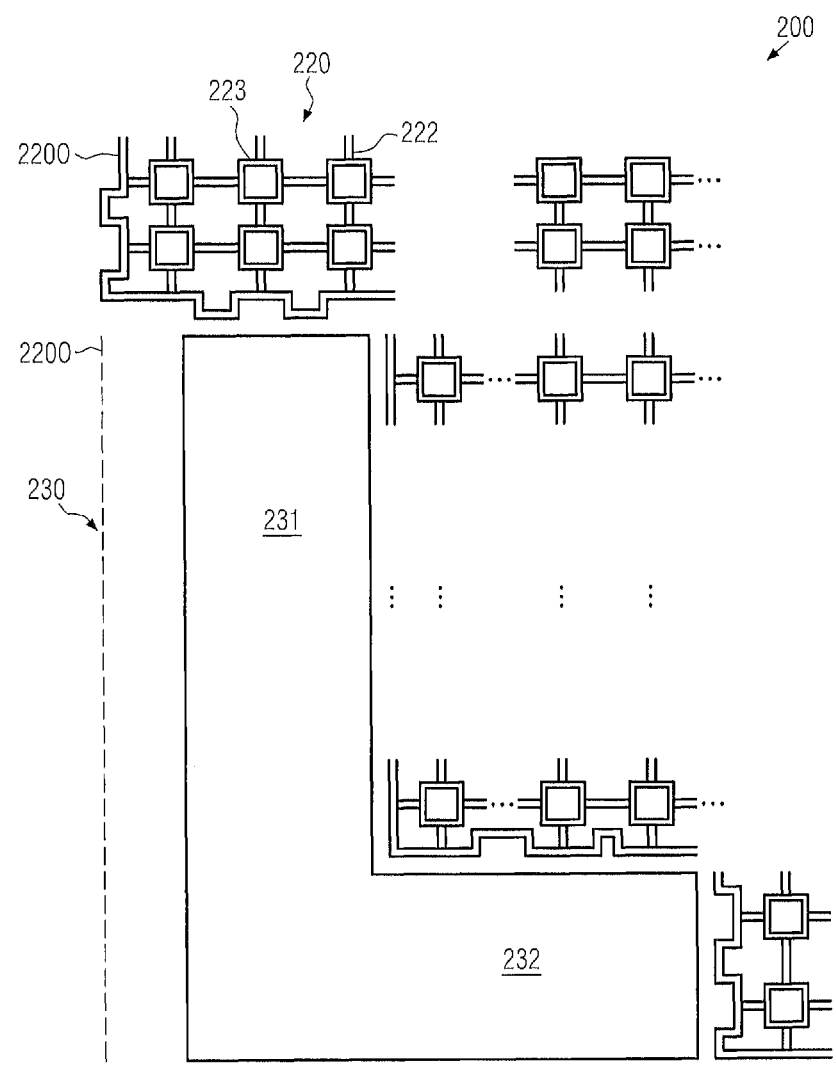
FIG. 2f schematically illustrates a top view of a portion of a die seal area with an integrated alignment mark, according to illustrative embodiments.

FIG. 2f schematically illustrates an enlarged top view of the device 200, i.e., of a portion of the die seal area 220. As shown, the die seal 222 may be comprised of a plurality of metal features 223, such as line portions, which may be appropriately connected so as to provide a high metal density and also ensure the required mechanical stability. Moreover, as shown, the metal features 223 may be appropriately offset from the alignment mark 230, as required for enabling an efficient optical detection of the alignment mark 230. That is, the lateral distance between the metal features 223, i.e., the actual die seal 222, and the alignment mark 230 is selected such that a corresponding process tool under consideration, i.e., its alignment mechanism, may reliably detect the difference in optical behavior between the metal features 223 and the portions 231, 232 of the alignment mark. Furthermore, as explained above, the lateral dimensions of the portions 231, 232 may be selected so as to not unduly reduce the width of the remaining metal features 223, if the overall mechanical stability of the portions 231, 232 is considered to be significantly less compared to the remaining die seal 222.

Figure 2G:
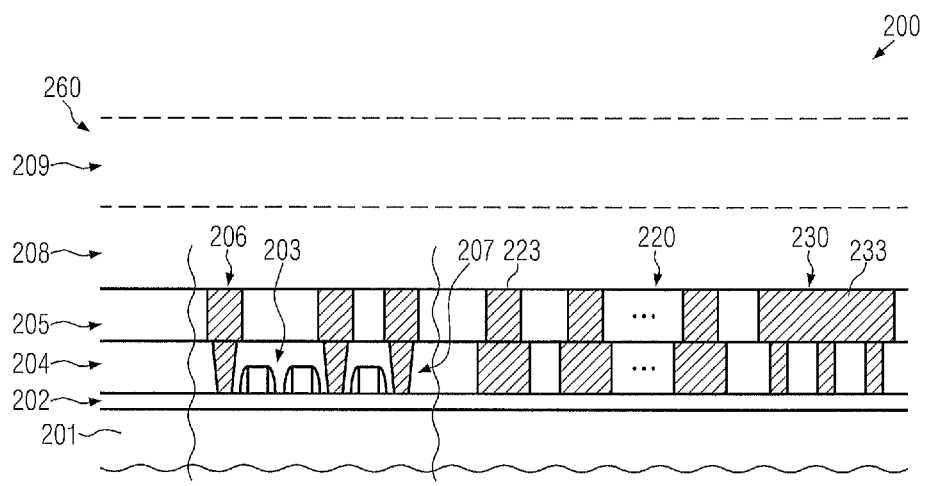
FIG. 2g schematically illustrates a cross-sectional view of the semiconductor device comprising a plurality of metallization layers having formed therein a die seal and an integrated alignment mark, according to still further illustrative embodiments.

FIG. 2g schematically illustrates a cross-sectional view of the device 200, which may comprise an appropriate substrate 201, such as a silicon substrate, a silicon/germanium substrate, or generally any appropriate carrier material for forming thereon a semiconductor layer 202, in and above which appropriate circuit elements 203 may be formed. Furthermore, the device 200 may comprise a metallization system 260, which in turn may comprise a plurality of metallization layers 205, 208, 209, in combination with an appropriate contact level 204, so as to appropriately connect the metallization system 260 to the circuit elements 203. As discussed above, typically, the die seal area 220 may be provided in each of the metallization layers 205, 208, 209 so as to form the mechanically stable network of metal features, which may finally connect to the semiconductor layer 202 via a contact level 204. For example, some of the metal features 223 are illustrated for convenience. Similarly, the alignment mark 230 may be formed within the die seal area 220, as discussed above, and may be provided at least in one of the metallization layers of the system 260, depending on the process requirements. For example, in metallization layers which may not have to be subjected to automatic alignment procedures, the corresponding metal features of the alignment mark 230 may be omitted and may be replaced by the corresponding metal features 223.

The semiconductor device 200 as shown in FIG. 2g may be formed on the basis of any appropriate manufacturing techniques. For example, the circuit elements 203 may be provided on the basis of the required manufacturing strategy and the design rules which, in sophisticated semiconductor devices, may require critical dimensions of 50 nm and less. Thereafter, the contact level 204 may be formed on the basis of an appropriate dielectric material or material system in combination with patterning strategies for forming contact elements 207 therein. At the same time, appropriate contact elements may also be provided for the die seal area 220. Thereafter, the plurality of metallization layers 205, 208, 209 may be provided, for instance, with well-established process techniques using inlaid techniques and the like, if sophisticated metallization systems based on copper are considered. During the patterning of the corresponding metal features 206 for connecting to the circuit elements 203 and the metal features 223 and, if required in the corresponding metallization layer, metal features of the alignment mark 203, appropriate lithography masks may be applied in order to take into consideration the desired geometric configuration of the alignment mark 230 and its positioning within the die seal area 220, as discussed above.

As a result, the present disclosure provides semiconductor devices in which the alignment marks may be positioned within the die seal area without significantly compromising the mechanical stability thereof. At the same time, any required spatial information may be efficiently encoded into the alignment marks in order to ensure a reliable alignment procedure during any measurement or production processes in which measurement sites or process sites have to be accessed within the inner die region of the devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
    a semiconductor layer formed above a substrate and comprising a plurality of circuit elements;
    a metallization system formed above said semiconductor layer, said metallization system comprising a plurality of metallization layers;
    a die seal area defined in at least one of said plurality of metallization layers and delimiting a die region, said die seal area comprising an inner boundary adjacent to said die region and an outer boundary adjacent to a frame region, said inner and outer boundaries determining a width of said die seal area;
    a die seal formed within said die seal area in said at least one of said plurality of metallization layers; and
    an alignment mark formed within said die seal area laterally adjacent to a portion of said die seal, said alignment mark comprising a first elongated mark portion and a second elongated mark portion, a width of said first and second elongated mark portions each being less than a width of said portion of said die seal and wherein said first and second elongated mark portions are spaced apart from a corner area of said die seal area, said first and second elongated marks being oriented so as to define a first included angle between said first and second elongated portions and wherein said inner boundary of said die seal area at said corner area defines a second included angle, said first and second included angles being approximately the same.

2. The semiconductor device of claim 1, wherein said alignment mark consists of said first and second mark portions.

3. The semiconductor device of claim 1, wherein said first mark portion has a first length and said second mark portion has a second length that differs from said first length.

4. The semiconductor device of claim 1, wherein each of said first and second elongated mark portions is positioned adjacent to said outer boundary of said die seal area.

5. The semiconductor device of claim 1, wherein said width of said die seal area is in the range of 5-25 µm.

6. The semiconductor device of claim 1, wherein the width of each of said mark portions is less than 30% of said width of said die seal area.

7. The semiconductor device of claim 1, wherein two or more alignment marks are formed within said die seal area.

8. The semiconductor device of claim 7, wherein at least two of said two or more alignment marks have a different geometric layout.

9. A semiconductor device, comprising:
    a semiconductor layer formed above a substrate and comprising a plurality of circuit elements;
    a metallization system formed above said semiconductor layer, said metallization system comprising a plurality of metallization layers;
    a die seal area defined in at least one of said plurality of metallization layers and delimiting a die region, said die seal area comprising an inner boundary adjacent to said die region and an outer boundary adjacent to a frame region, said inner and outer boundaries determining a width of said die seal area;
    a die seal formed within said die seal area in said at least one of said plurality of metallization layers; and
    an alignment mark formed at least partially within said die seal area laterally adjacent to said outer boundary, said alignment mark comprising a first elongated mark portion having a first width and a second elongated mark portion having a second width, wherein each of said first and second widths is less than approximately 30% of said width of said die seal area and wherein said first and second elongated mark portions are spaced apart from a corner area of said die seal area, said first and second elongated marks being oriented so as to define a first included angle between said first and second elongated portions and wherein said inner boundary of said die seal area at said corner area defines a second included angle, said first and second included angles being approximately the same.

10. The semiconductor device of claim 9, wherein said first and second widths are approximately the same.

11. The semiconductor device of claim 9, wherein a first portion of said die seal is formed laterally adjacent to said first mark portion and a second portion of said die seal is formed laterally adjacent to said second mark portion.

12. The semiconductor device of claim 9, wherein said alignment mark consists of said first and second elongated mark portions.

13. The semiconductor device of claim 9, wherein said width of said die seal area is substantially equal around said die seal and is in the range from 5-25 µm.

14. The semiconductor device of claim 9, further comprising at least a second alignment mark formed within said die seal area, wherein said at least a second alignment mark is positioned laterally adjacent to said outer boundary.

15. The semiconductor device of claim 9, wherein said die seal comprises two or more annular seal rings formed laterally adjacent to each other within said die seal area, wherein said first and second mark portions replace a portion of an outermost one of said two or more seal rings.

16. A semiconductor device comprising:
an alignment mark formed in a die seal area, said alignment mark comprising a first elongated mark portion connected to a second elongated mark portion, each of said first and second elongated mark portions being aligned to and formed laterally adjacent to an outer boundary of said die seal area, wherein a width of said die seal area is in the range from 5-25 μm and wherein a width of each of said first and second elongated mark portions is less than approximately 30% of said width of said die seal area and wherein said first and second elongated mark portions are spaced apart from a corner area of said die seal area, said first and second elongated marks being oriented so as to define a first included angle between said first and second elongated portions and wherein an inner boundary of said die seal area at said corner area defines a second included angle, said first and second included angles being approximately the same.

17. The semiconductor device of claim 16, wherein said widths of said first and second elongated mark portions are approximately the same.

\* \* \* \* \*